(12) United States Patent
Fu et al.

(10) Patent No.: US 10,514,814 B2
(45) Date of Patent: Dec. 24, 2019

(54) DISPLAY PANEL AND DISPLAY DEVICE

(71) Applicant: WUHAN TIANMA MICRO-ELECTRONICS CO., LTD., Wuhan (CN)

(72) Inventors: Huiqin Fu, Wuhan (CN); Jiazhu Zhu, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/135,554

(22) Filed: Sep. 19, 2018

(65) Prior Publication Data
US 2019/0018526 A1   Jan. 17, 2019

(30) Foreign Application Priority Data

Jun. 7, 2018 (CN) .......................... 2018 1 0582593

(51) Int. Cl.
| | |
|---|---|
| *G06F 3/047* | (2006.01) |
| *H01L 27/12* | (2006.01) |
| *G09G 3/3275* | (2016.01) |
| *G06F 3/041* | (2006.01) |
| *H01L 27/32* | (2006.01) |

(52) U.S. Cl.
CPC ............ *G06F 3/047* (2013.01); *G06F 3/0416* (2013.01); *G09G 3/3275* (2013.01); *H01L 27/124* (2013.01); *H01L 27/3276* (2013.01); *G09G 2300/0426* (2013.01)

(58) Field of Classification Search
CPC ... G06F 3/047; G06F 3/0416; H01L 27/3276; H01L 27/124; G09G 3/3275; G09G 2300/0426
See application file for complete search history.

(56) References Cited

U.S. PATENT DOCUMENTS

2017/0309644 A1* 10/2017 Yeh .................. H01L 27/124
2018/0130856 A1*  5/2018 Kim .................. H01L 51/0097

FOREIGN PATENT DOCUMENTS

| CN | 104699349 A | 6/2015 |
|---|---|---|
| CN | 107274837 A | 10/2017 |

* cited by examiner

*Primary Examiner* — Andrew Sasinowski
(74) *Attorney, Agent, or Firm* — Anova Law Group PLLC

(57) ABSTRACT

A display panel includes a substrate that comprises a display area and a non-display area. In the display area, a plurality of first signal lines are arranged along a first direction, and extend along a second direction. The non-display area includes a fan-out wiring area and a binding area, and the fan-out wiring area is located between the display area and the binding area. A plurality of fan-out lines are located in the fan-out wiring area, and a plurality of conductive connection portions are located in the binding area. The fan-out lines include a first fan-out line, a second fan-out line, and a third fan-out line, and a first end of the first fan-out line, a first end of the second fan-out line, and a first end of the third fan-out line are electrically connected to the first signal lines respectively. The first fan-out line, the second fan-out line, and the third fan-out line are located at different layers respectively. The plurality of conductive connection portions are electrically connected to a second end of the first fan-out line, a second end of the second fan-out line, and a second end of the third fan-out line in one-to-one correspondence.

17 Claims, 8 Drawing Sheets

DISPLAY PANEL AND DISPLAY DEVICE

CROSS-REFERENCES TO RELATED APPLICATIONS

This application claims priority of Chinese Patent Application No. 201810582593.5, filed on Jun. 7, 2018, the entire contents of which are hereby incorporated by reference.

FIELD OF THE INVENTION

The present disclosure generally relates to the field of display technologies and, more particularly, relates to a display panel and a display device.

BACKGROUND

As the application of display panels becomes more widespreading, widescreen technology has become an important technology in the display technologies. At the same time, the narrow bottom frame technology for display panels is becoming more and more important.

In the prior art, a display panel has a plurality of first signal lines and second signal lines that are arranged in an intersecting manner. Each of the first signal line leads out at a bottom frame position of the display panel, through a plurality of fan-out lines located in a fan-out wiring area of the display panel. Typically, multiple fan-out lines are placed side by side in a fan-out wiring area, and they are made of a same metal material. Due to limitations of process capabilities, the spacing between fan-out lines in a same layer needs to reach 3 μm, and the width of fan-out lines needs to reach 3 μm. Since there are many fan-out lines corresponding to first signal lines, and all the fan-out lines are arranged side by side, the wiring space of a fan-out wiring area needs to be very large. Therefore, it is quite often to meet the problem of insufficient wiring space in a fan-out wiring area, and it is also difficult to achieve a narrow bottom frame design.

The disclosed methods and structures are directed to solve one or more problems set forth above and other problems in the art.

BRIEF SUMMARY OF THE DISCLOSURE

One aspect of the present disclosure includes a display panel. The display panel includes a substrate that comprises a display area and a non-display area. In the display area, a plurality of first signal lines are arranged along a first direction, and extend along a second direction. The non-display area includes a fan-out wiring area and a binding area, and the fan-out wiring area is located between the display area and the binding area. A plurality of fan-out lines are located in the fan-out wiring area, and a plurality of conductive connection portions are located in the binding area. The fan-out lines include a first fan-out line, a second fan-out line, and a third fan-out line, and a first end of the first fan-out line, a first end of the second fan-out line, and a first end of the third fan-out line are electrically connected to the first signal lines respectively. The first fan-out line, the second fan-out line, and the third fan-out line are located at different layers respectively. The plurality of conductive connection portions are electrically connected to a second end of the first fan-out line, a second end of the second fan-out line, and a second end of the third fan-out line in one-to-one correspondence.

Another aspect of the present disclosure includes a display device. The display device includes a display panel comprising a substrate that includes a display area and a non-display area. In the display area, a plurality of first signal lines are arranged along a first direction, and extend along a second direction. The non-display area includes a fan-out wiring area and a binding area, and the fan-out wiring area is located between the display area and the binding area. A plurality of fan-out lines are located in the fan-out wiring area, and a plurality of conductive connection portions are located in the binding area. The fan-out lines include a first fan-out line, a second fan-out line, and a third fan-out line, and a first end of the first fan-out line, a first end of the second fan-out line, and a first end of the third fan-out line are electrically connected to the first signal lines respectively. The first fan-out line, the second fan-out line, and the third fan-out line are located at different layers respectively. The plurality of conductive connection portions are electrically connected to a second end of the first fan-out line, a second end of the second fan-out line, and a second end of the third fan-out line in one-to-one correspondence.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
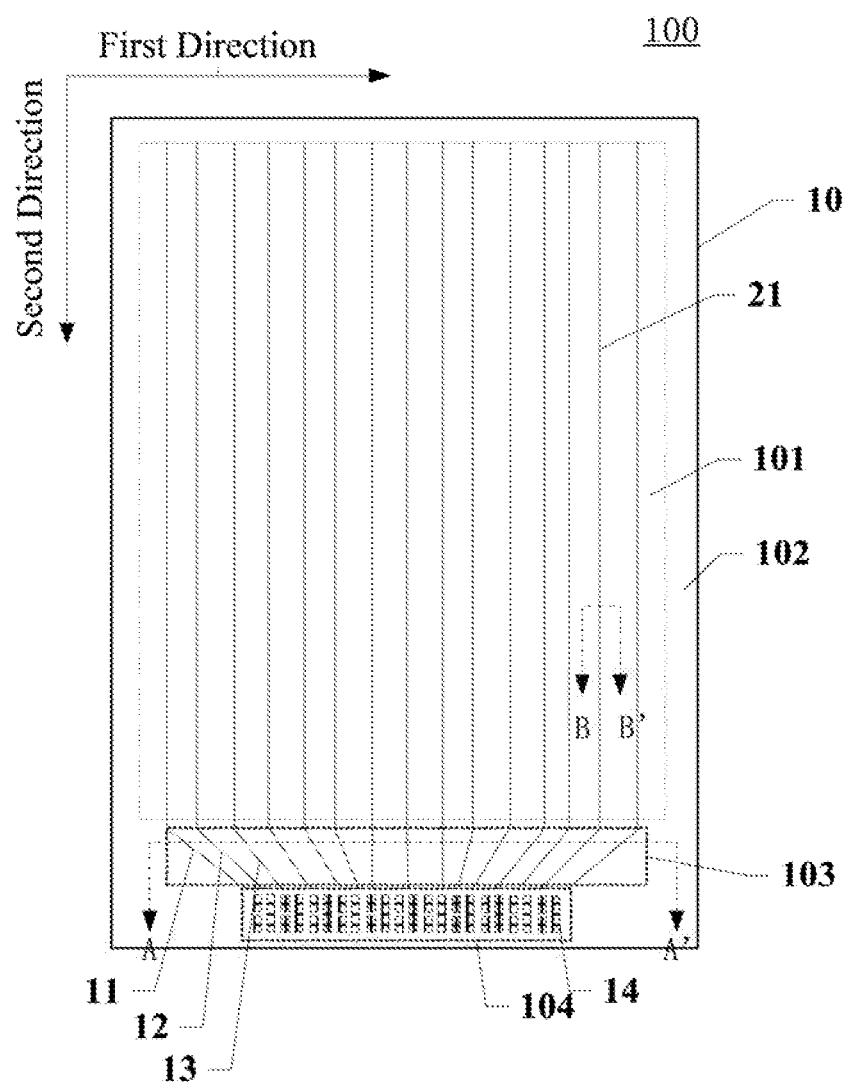
FIG. 1 illustrates a top view of an exemplary display panel consistent with the disclosed embodiments.

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

In the present disclosure, certain terms are used to refer to particular components. Those skilled in the art should understand that hardware manufacturers may use different terms to refer to a same component. In the present disclosure, components are distinguished based on the differences in their functions, instead of the differences in their names. The word "including" used in the present disclosure is an open term, and should be interpreted as "including but not limited to". The word "approximately" means that within an acceptable error range, those skilled in the art are able to solve the technical problems, and substantially achieve the technical effects. The word "coupling" is used herein to include any direct and indirect electrical coupling means. In the present disclosure, if a first device is electrically coupled to a second device, the first device may be electrically coupled to the second device directly, or the first device may be electrically coupled indirectly to the second device, through other devices or coupling means.

In the prior art, a display panel has a plurality of first signal lines and second signal lines that are arranged in an intersecting manner. Each of the first signal line leads out at a bottom frame position of the display panel, through a plurality of fan-out lines located in a fan-out wiring area of the display panel. Typically, multiple fan-out lines are placed side by side in a fan-out wiring area, and they are made of a same metal material. Due to limitations of process capabilities, the spacing between fan-out lines in a same layer needs to reach 3 μm, and the width of fan-out lines needs to reach 3 μm. Since there are many fan-out lines corresponding to first signal lines, and all the fan-out lines are arranged side by side, the wiring space of a fan-out wiring area needs to be very large. Therefore, it is quite often to meet the problem of insufficient wiring space in a fan-out wiring area, and it is also difficult to achieve a narrow bottom frame design.

The present invention provides an improved display panel and display device, where a fan-out wiring area corresponding to first signal lines adopts a three-layer wiring format. The three-layer wiring format greatly saves the wiring space of the fan-out wiring area, and is beneficial to realizing the narrow bottom frame design for display panels and display devices.

Figure 2:
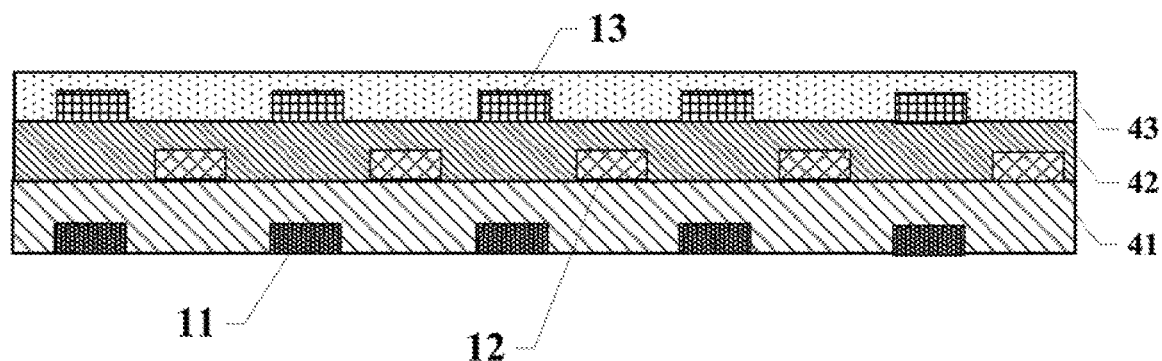
FIG. 2 illustrates an exemplary cross-sectional view at the A-A' cross section of the exemplary display panel illustrated in FIG. 1, consistent with the disclosed embodiments.

FIG. 1 illustrates a top view of an exemplary display panel consistent with the disclosed embodiments, and FIG. 2 illustrates an exemplary cross-sectional view at the A-A' cross section of the exemplary display panel illustrated in FIG. 1. As shown in FIG. 1 and FIG. 2, a display panel 100 includes a substrate 10, comprising a display area 101 and a non-display area 102. In the display area 101, a plurality of first signal lines 21 are arranged along a first direction, and extend along a second direction. The non-display area 102 includes a fan-out wiring area 103 and a binding area 104. The fan-out wiring area 103 is located between the display area 101 and the binding area 104. A plurality of fan-out lines are located in the fan-out wiring area 103, and a plurality of conductive connection portions 14 are located in the binding area 104.

The fan-out lines include a first fan-out line 11, a second fan-out line 12, and a third fan-out line 13. The first ends of the first fan-out line 11, the second fan-out line 12, and the third fan-out lines 13 are electrically connected to the first signal lines 21 respectively. As shown in FIG. 2, the first fan-out line 11, the second fan-out line 12, and the third fan-out line 13 are located in different layers respectively.

The plurality of conductive connection portions 14 are electrically connected to the second ends of the first fan-out line 11, the second fan-out line 12 and the third fan-out line 13 in one-to-one correspondence.

Specifically, in the exemplary embodiment shown in FIG. 1, the fan-out wiring area 103 and the binding area 104 are located at the lower frame of the display panel 100. The first signal lines 21 located in the display area 101 are electrically connected, through the fan-out wiring area 103, to the conductive connection portions 14 at the binding area 104. The binding area 104 is used to bind a driving chip and is electrically connected to the driving chip. Therefore, the first signal lines 21 may be electrically connected to the driving chip, and thus achieve signal transmission. In particular, as shown in FIG. 2, the first fan-out line 11, the second fan-out line 12, and the third fan-out line 13 corresponding to the first signal lines 21 are located in different layers respectively.

As shown in FIG. 2, compared with the prior art, the present embodiment is equivalent to distributing the fan-out lines originally located in a same layer in the prior layer to three different layers. In this way, the spacing between two adjacent fan-out lines in the top view of a display panel may be reduced. Even if, the spacing of adjacent fan-out lines at each layer and the width of each fan-out line are consistent with the prior art, the present invention may also reduce the width of the fan-out wiring area 103. This design may decrease the overall width of the fan-out wiring area 103, saving the wiring space of the fan-out wiring area 103. Further, by dividing the fan-out wiring into three layers, the distance between the fan-out wiring area 103 and the binding area 104 may be reduced, and this is favorable for realizing the narrow bottom frame design of a display panel.

It should be noted that, the figures illustrating the exemplary embodiments of the present invention only schematically illustrate the positional relationships between the first signal lines and the fan-out lines. The numbers and sizes of the first signal lines and the fan-out lines in the figures are not actual numbers and sizes, and they are for illustrative purposes only.

Figure 3:
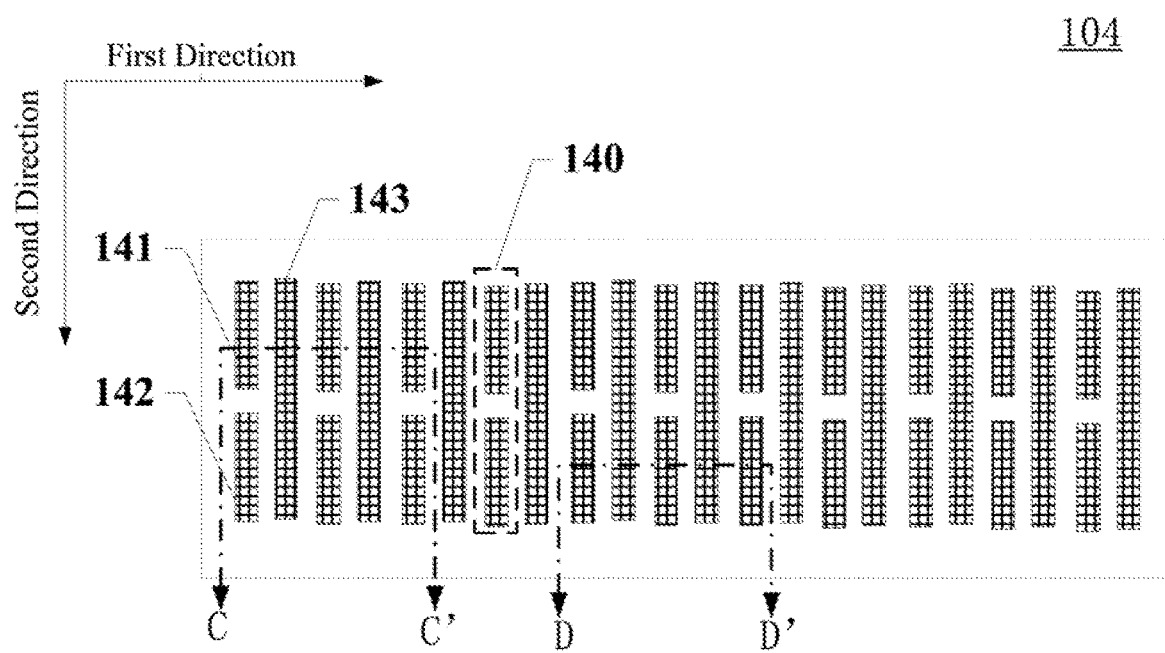
FIG. 3 illustrates a top view of an exemplary binding area consistent with the disclosed embodiments.

FIG. 3 illustrates a top view of an exemplary binding area consistent with the disclosed embodiments. As shown in FIG. 3, the conductive connection portions 14 in the binding area 104 of the display panel 100 include a first conductive connection portion 141, a second conductive connection portion 142, and a third conductive connection portion 143. The first conductive connection portion 141, the second conductive connection portion 142, and the third conductive connection portion 143 are located in a same layer. The first conductive connection portion 141 and the second conductive connection portion 142 are insulatively arranged along the second direction.

Specifically, as shown in FIG. 3, the binding area 104 is provided with a first conductive connection portion 141, a second conductive connection portion 142, and a third conductive connection portion 143, which are electrically connected to the first fan-out line 11, the second fan-out line 12, and the third fan-out line 13, respectively. In one embodiment, to facilitate binding a driving chip, the first conductive connection portion 141, the second conductive connection portion 142 and the third conductive connection portion 143 are disposed on a same layer. In particular, in one embodiment, the first conductive connection portion 141 and the second conductive connection portion 142 are insulatively arranged in the second direction. Compared to the prior art where all the conductive connection portions 14 are arranged in the first direction, the present arrangement may reduce the overall width of the binding area 104.

In the top view shown in FIG. 1, the present arrangement may also save the space of the non-display area 102 at both sides of the binding area 104. The space of the non-display area 102 released due to the reduction of the width of the binding area 104 may be used to set peripheral protection circuits for the display panel 100. For example, the released space may be used to place an electrostatic protection circuit. In addition to protection circuits, the released space may also be used to place other circuits to improve the overall performance of the display panel 100.

Optionally, as shown in FIG. 3, in the conductive connection portions 14 of the present embodiment, at least one first conductive connection portion 141 and at least one second conductive connection portion 142 are arranged in the second direction, combining into one conductive connection portion unit 140. The third conductive connection portion 143 and the conductive connection portion unit 140 are alternately arranged in the first direction.

Specifically, in present embodiment, the adjacent first conductive connection portion 141 and the second conductive connection portion 142 are insulatively arranged in the second direction, forming a conductive connection portion unit 140. The conductive connection portion unit 140 and the third conductive connection portions 143 are alternately arranged in the first direction. Assuming that the binding area 104 is divided into a plurality of sub-binding areas in the first direction, in the exemplary embodiment shown in FIG. 3, the adjacent first conductive connection portion 141 and second conductive connection portion 142 are located in a same sub-binding area, sharing the space of one sub-binding area. Therefore the number of sub-binding areas in the binding area 104 may be reduced, and thus the width of the binding area 104 in the first direction may be reduced. This arrangement is advantageous for realizing the narrow bottom frame design of a display panel 100. In addition, the space released on both sides of the binding area 104 may be used to set other peripheral protection circuits.

Figure 4:
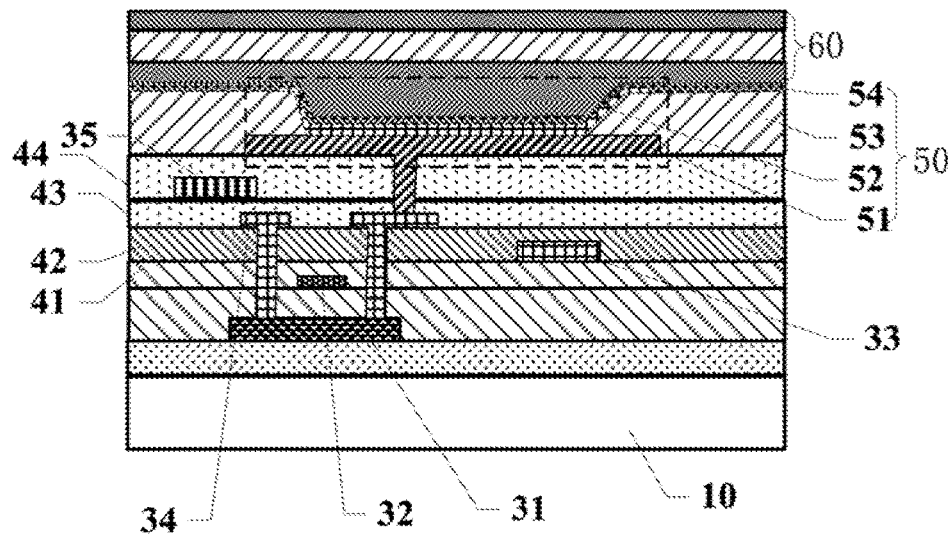
FIG. 4 illustrates an exemplary cross-sectional view at the B-B' cross section of the exemplary display panel illustrated in FIG. 1, consistent with the disclosed embodiments.

Optionally, FIG. 4 illustrates an exemplary cross-sectional view at the B-B' cross section of the exemplary display panel illustrated in FIG. 1. As shown in FIG. 4, in the present embodiment, the display panel 100 further includes a gate metal layer 32, a first insulating layer 41, a capacitor metal layer 33, a second insulating layer 42, a source/drain metal layer 34, a third insulating layer 43, and a touch-control metal layer 35, which are sequentially disposed on the substrate 10 in a direction away from the substrate 10.

Referring to FIG. 2 and FIG. 4, the first fan-out line 11 is located at the gate metal layer 32, the second fan-out line 12 is located at the capacitor metal layer 33, and the third fan-out line 13 is located at the source/drain metal layer 34.

Specifically, referring to FIG. 2 and FIG. 4, in the fan-out wiring area 103, the existing metal layers (i.e., gate metal layer 32, capacitor metal layer 33, and source/drain metal layer 34) on the display panel 100 are utilized to form the first fan-out line 11, the second fan-out line 12, and the third fan-out line 13. Though the first fan-out line 11, the second fan-out line 12, and the third fan-out line 13 are located in different layers, it is not necessary to set additional layer structures for the fan-out lines at different layers, and the existing layers may be reused. Therefore this configuration is beneficial to simplify the production steps and improve the production process.

Figure 5:
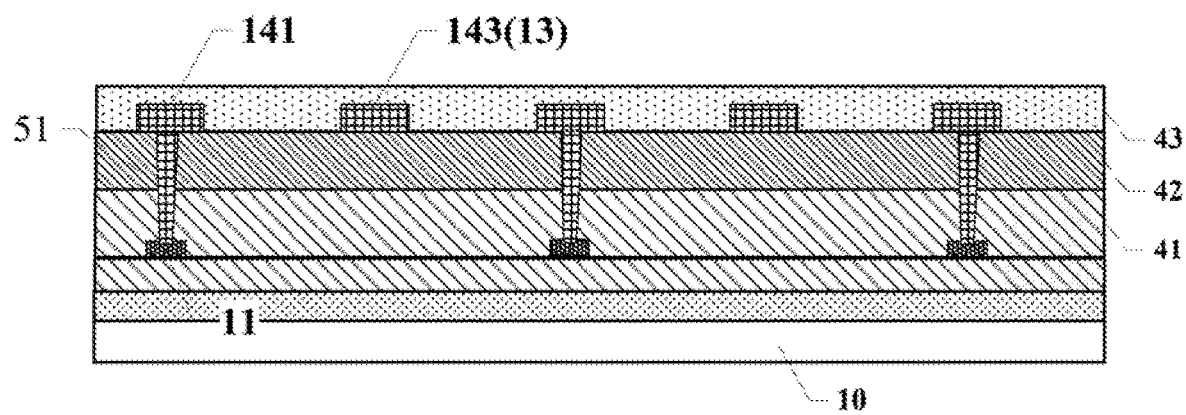
FIG. 5 illustrates an exemplary cross-sectional view at the C-C' cross section of the exemplary binding area illustrated in FIG. 3, consistent with the disclosed embodiments.
Figure 6:
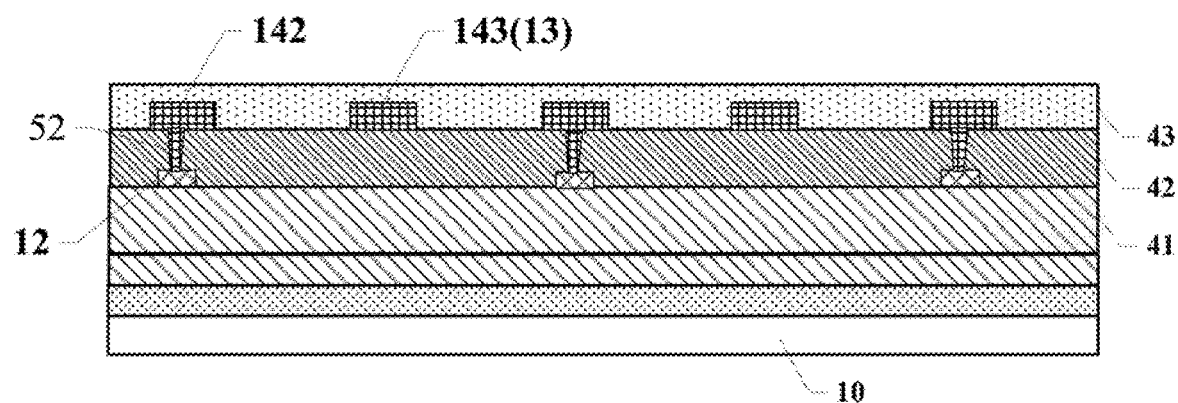
FIG. 6 illustrates an exemplary cross-sectional view at the D-D' cross section of the exemplary binding area illustrated in FIG. 3, consistent with the disclosed embodiments.

Optionally, FIG. 5 illustrates an exemplary cross-sectional view at the C-C' cross section of the exemplary binding area illustrated in FIG. 3, and FIG. 6 illustrates an exemplary cross-sectional view at the D-D' cross section of the exemplary binding area illustrated in FIG. 3. In the present embodiment, the first conductive connection portion 141, the second conductive connection portion 142, the third conductive connection portion 143 are located at the source/drain metal layer 34 shown in FIG. 4.

The second end of the first fan-out line 11 is electrically connected to the first conductive connection portion 141 through a first via hole 51 located at the first insulating layer 41 and the second insulating layer 42. The second end of the second fan-out line 12 is electrically connected to the second conductive connection portion 142 through a second via hole 52 located at the second insulating layer 42.

Specifically, the second ends of the first fan-out line 11, the second fan-out line 12, and the third fan-out line 13 are electrically connected to the first conductive connection portion 141, the second conductive connection portion 142, and the third conductive connection portion 143, respectively. As the first conductive connection portion 141, the second conductive connection portion 142, and the third conductive connection portion 143 are located at the source/drain metal layer 34, the third fan-out line 13 located in the source/drain metal layer 34 and the third conductive connection portion 143 are located at a same layer, and the electrical connection between them may be achieved without a via hole. Since the first fan-out line 11 and the first conductive connection portion 141 are located at different layers, the realization of the electrical connection between them needs a first via hole 51. Similarly, since the second fan-out line 12 and the second conductive connection portion 142 are located at different layers, a second via hole 52 is needed for realizing the electrical connection between them. In addition, in present embodiment, each of the conductive connection portions 14 reuses the existing source/drain metal layer 34, and it is not necessary to set additional metal layers for the conductive connection portions 14. Therefore this configuration is beneficial to simplify the production steps and improve the production process.

Figure 7:
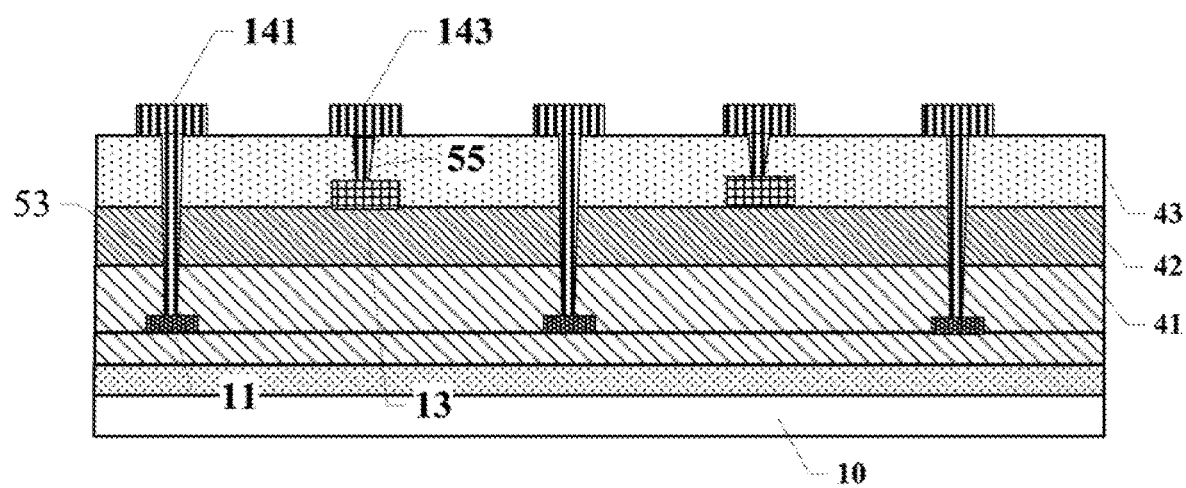
FIG. 7 illustrates another exemplary cross-sectional view at the C-C' cross section of the exemplary binding area illustrated in FIG. 3, consistent with the disclosed embodiments.
Figure 8:
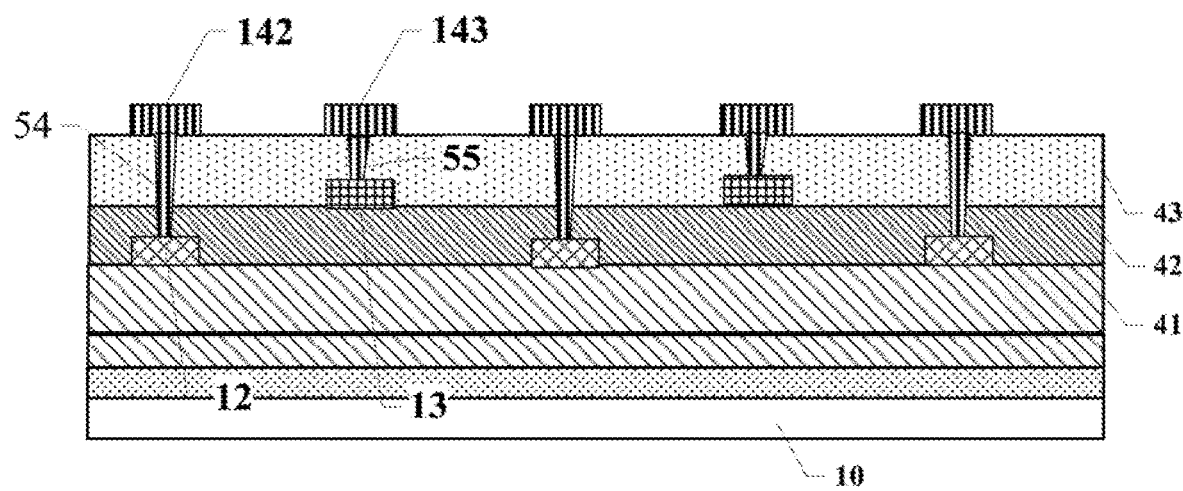
FIG. 8 illustrates another exemplary cross-sectional view at the D-D' cross section of the exemplary binding area illustrated in FIG. 3, consistent with the disclosed embodiments.

Optionally, FIG. 7 illustrates another exemplary cross-sectional view at the C-C' cross section of the exemplary binding area illustrated in FIG. 3, and FIG. 8 illustrates another exemplary cross-sectional view at the D-D' cross section of the exemplary binding area illustrated in FIG. 3. As shown in FIG. 4, FIG. 7 and FIG. 8, the first conductive connection portion 141, the second conductive connection portion 142, and the third conductive connection portion 143 are located at the touch-control metal layer 35.

Referring to FIG. 7, the second end of the first fan-out line 11 is electrically connected to the first conductive connection portion 141 through a third via hole 53 at the first insulating layer 41, the second insulating layer 42, and the third insulating layer 43. Referring to FIG. 8, the second end of the second fan-out line 12 is electrically connected to the second conductive connection portion 142 through a fourth via hole 54 at the second insulating layer 42 and the third insulating layer 43. Referring to FIGS. 7 and 8, the second end of the third fan-out line 13 is electrically connected to the third conductive connection portion 143 through a fifth via hole 55 located at the third insulating layer 43.

Specifically, the second ends of the first fan-out line 11, the second fan-out line 12 the third fan-out line 13 are electrically connected to the first conductive connection portion 141, the second conductive connection portion 142, and the third conductive connection portion 143, respectively. The first conductive connection portion 141, the second conductive connection portion 142, and the third conductive connection portion 143 are located on the touch-contact metal layer 35. As the first fan-out line 11 is located on the gate metal layer 32, the first conductive connection portion 141 and the first connection portion 141 are in different film layers. The realization of the electrical connection between the first conductive connection portion 141 and the first fan-out line 11 needs a third via hole 53, as shown in FIG. 7. The second fan-out line 12 is located at the touch-control metal layer 35, and the second conductive connection portion 142 is located at a different film layer. The realization of the electrical connection between the second conductive connection portion 142 and the second fan-out line 12 needs a fourth via hole 54, as shown in FIG. 8. The third fan-out line 13 is located at the source/drain metal layer 34, and the third conductive connection portion 143 is located at a different film layer. The realization of the electrical connection between the third conductive connection portion 43 and the third fan-out line 13 needs a fifth via hole 55, as shown in FIG. 7 and FIG. 8. In present embodiment, each of the conductive connection portions 14 reuses the existing source/drain metal layer 35, and it is not necessary to place additional metal layers for the conductive connection portions 14. Therefore, this configuration is beneficial to simplify the production steps and improve the production process.

Figure 9:
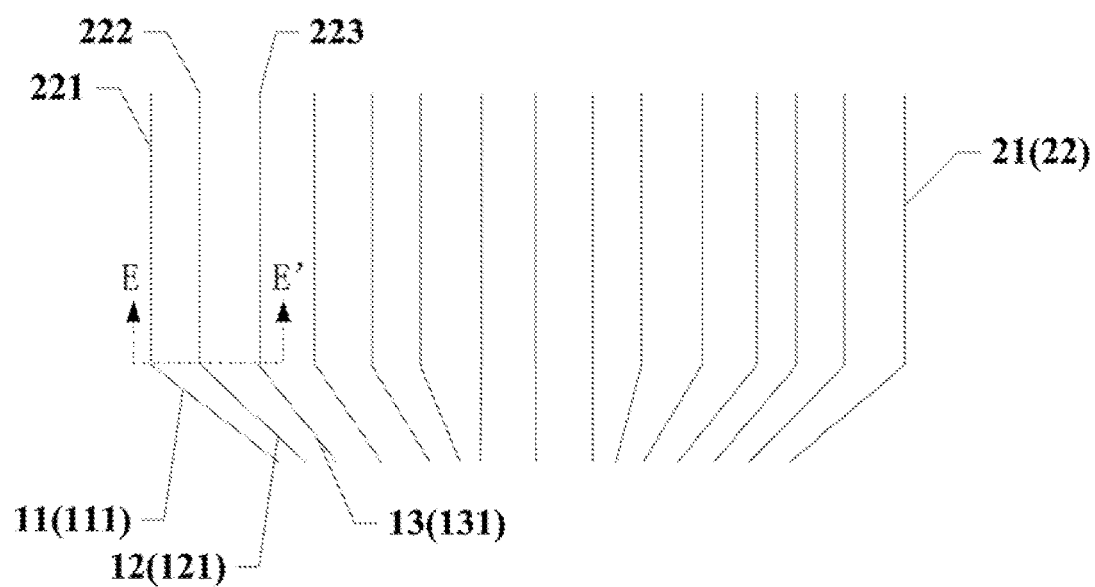
FIG. 9 illustrates a schematic diagram of an exemplary connection between data signal lines and fan-out lines in an exemplary display panel consistent with the disclosed embodiments.

Optionally, FIG. 9 illustrates a schematic diagram showing an exemplary connection between data signal lines and fan-out lines in an exemplary display panel 100. Referring to FIG. 4 and FIG. 9, the first signal line 21 in the present embodiment include a data signal line 22 that is located at the source/drain metal layer 34.

Any three consecutive data signal lines 22 are electrically connected to a first fan-out line 11, a second fan-out line 12, and a third fan-out line 13, respectively. Any two adjacent data signal lines 22 are electrically connected to fan-out lines located at different layers respectively.

Specifically, in a display panel 100 of the present embodiment, any three consecutive data signal lines 22 are respectively connected to fan-out lines located at three different layers. That is, the first fan-out lines 11 arranged along the first direction are electrically connected to the (3*(n−1)+1)th data signal lines 22 arranged along the first direction, respectively; the second fan-out lines 12 arranged along the first direction are electrically connected to the (3*(n−1)+2)th data signal lines 22 arranged along the first direction, respectively; and the third fan-out lines 13 arranged in the first direction are electrically connected to the (3*(n−1)+3)th signal data signal lines 22 arranged along the first direction respectively, wherein n is a positive integer ≥1. Corresponding to FIG. 9, the first data signal line 221 is electrically connected to the first fan-out line 111, and the second data signal line 222 is electrically connected to the second fan-out line 121, and the third data signal line 223 is electrically connected to the third fan-out line 131, and so on. In the present embodiment, the fan-out lines electrically connected to any two adjacent data signal lines 22 are located at different layers, effectively avoiding the crosstalk due to the close distance between fan-out lines if the fan-out lines are located at a same layer.

Figure 10:
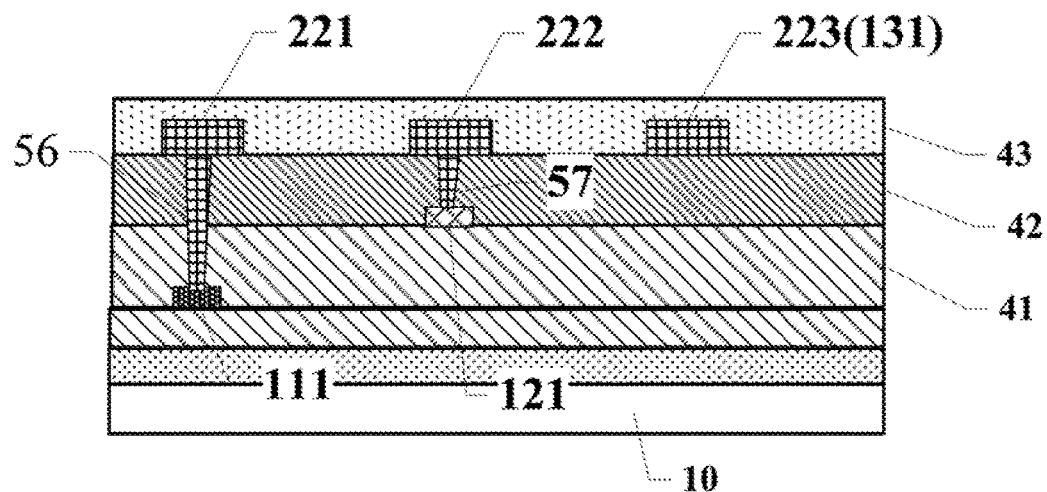
FIG. 10 illustrates an exemplary cross-sectional view at the E-E' cross section of the exemplary connection between a data signal line and a fan-out line illustrated in FIG. 9, consistent with the disclosed embodiments.

Optionally, FIG. 10 illustrates an exemplary cross-sectional view at the E-E' cross section of the exemplary connection between a data signal line and a fan-out line illustrated in FIG. 9. As shown in FIG. 10, the first end of the first fan-out line 111 is electrically connected to the data signal line 221 through a sixth via hole 56 located at the first insulating layer 41 and the second insulating layer 42. The first end of the second fan-out line 121 is electrically connected to the data signal line 222 through a seventh via hole 57 located at the second insulating 42.

Specifically, since the data signal line 22 (223) is located at the source/drain metal layer 34, and the third fan-out line 13 (131) is also located at the source/drain metal layer 34, the electrical connection between the first end of the third fan-out line 13 (131) and the data signal line 22 (223) may be achieved without a via hole. Since the first fan-out line 11 (111) is located at the gate metal layer 32, the realization of the electrical connection between the first end of the first fan-out line 11 (111) and the data signal line 22 (221) needs a sixth via hole 56. Since the second fan-out line 12 (121) is located in the capacitor metal layer, the realization of the electrical connection between the first end of the second fan-out line 12 (121) and the data signal line 22 (222) needs a seventh via hole 57.

Figure 11:
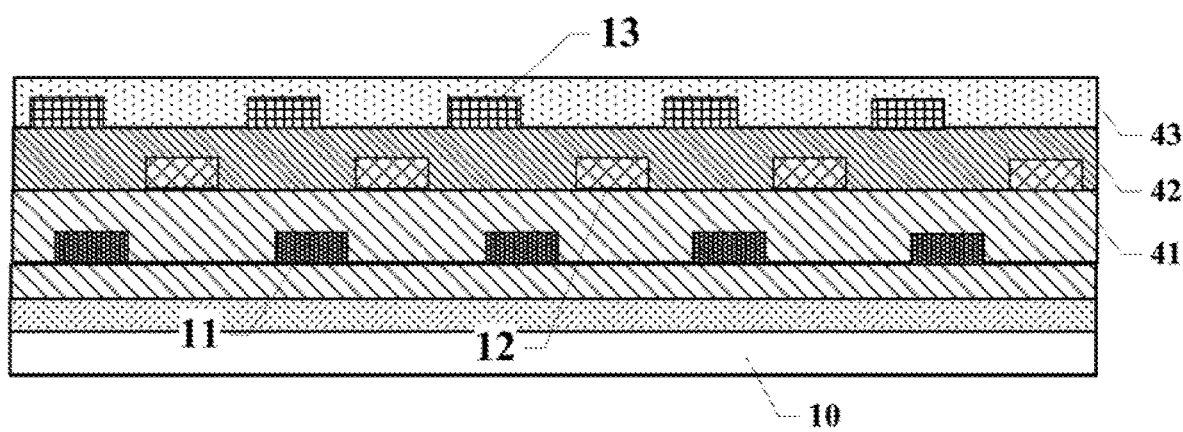
FIG. 11 illustrates another exemplary cross-sectional view at the A-A' cross section of the exemplary display panel illustrated in FIG. 1, consistent with the disclosed embodiments.

Optionally, FIG. 11 illustrates another exemplary cross-sectional view at the A-A' cross section of the exemplary display panel illustrated in FIG. 1. Referring to FIG. 11 and FIG. 2, the orthographic projection of the first fan-out line 11 on the plane of the substrate 10 and the orthographic projection of the third fan-out line 13 at the plane of the substrate 10 overlap, at least partially.

Specifically, to avoid the crosstalk that may occur when the distance between signal lines is very close, it is necessary to maintain a certain distance between adjacent signal lines at the time of wiring. In present embodiment, since the first fan-out line 11 and the third fan-out line 13 are separated by two insulating layers (the first insulating layer 41 and the second insulating layer 42), and the distance between the two fan-out lines in the direction perpendicular to the substrate 10 is relatively large, the crosstalk does not occur even if there is an overlap between them. Therefore, the orthographic projections of the first fan-out line 11 and the third fan-out line 13 may be set to partially overlap as shown in FIG. 11 or totally overlap as shown in FIG. 2. This configuration is beneficial for reducing the wiring width of the fan-out wiring area, saving the wiring space of the fan-out wiring area, and is thus beneficial for realizing the narrow bottom frame design of a display panel.

Optionally, referring to FIG. 2 and FIG. 11, the orthographic projection of the second fan-out line 12 on the plane of the substrate 10 does not overlap with the orthographic projection of the first fan-out line 11 on the plane of the substrate 10. The orthographic projection of the second fan-out line 12 on the plane of the substrate 10 does not overlap with the orthographic projection of the third fan-out line 13 on the plane of the substrate 10.

Specifically, in the embodiment shown in FIG. 2 and FIG. 11, in the direction perpendicular to the substrate 10, the second fan-out line 12 is located between the first fan-out line 11 and the third fan-out line 13. Only the first insulating layer 41 is spaced between the adjacent second fan-out line 12 and first fan-out line 11, and only the second insulating layer 42 is spaced between the adjacent second fan-out line 12 and the third fan-out line 13.

In the present embodiment, the orthographic projections of the adjacent second fan-out line 12 and the first fan-out line 11 are offset from each other and do not overlap with each other; and the orthographic projections of the adjacent second fan-out line 12 and the third fan-out lines 13 are offset from each other and do not overlap with each other. This configuration may avoid the crosstalk between the adjacent second fan-out lit 12 and the first fan-out line 11, and may also avoid crosstalk between the adjacent second fan-out line 12 and the third fan-out line 13.

Figure 12:
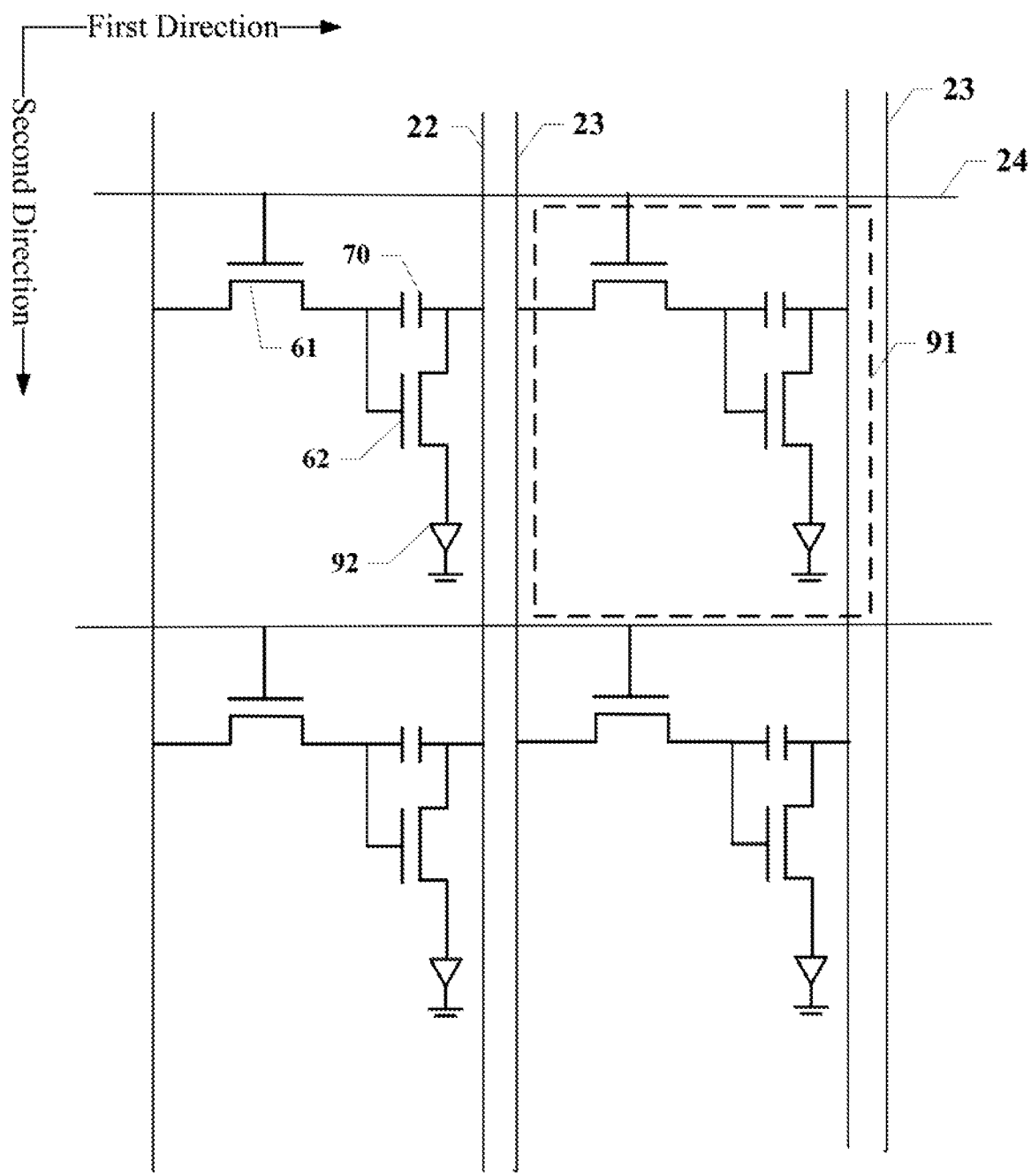
FIG. 12 illustrates a schematic diagram of an exemplary pixel circuit in an exemplary display panel consistent with the disclosed embodiments.

Optionally, FIG. 12 illustrates a schematic diagram of an exemplary pixel circuit in an exemplary display panel. The display panel 100 further includes a plurality of power line 23 arranged along the first direction and extending along the second direction. The power lines 23 are located on the touch-control metal layer 35 as shown in FIG. 4. The display panel 100 further includes a plurality of gate lines 24 arranged along the second direction and extending along the first direction. The adjacent data signal lines 22 and the gate lines 24 intersect defining a plurality of sub-pixel units 91. The power lines 23 are used to supply a constant voltage to each sub-pixel unit 91.

Referring to FIG. 1 and FIG. 4, in the present embodiment, the first fan-out line 11, the second fan-out line 12, and the third fan-out line 13 corresponding to the first signal line 21 are respectively located at the gate metal layer 32, the capacitor metal layer 33 and the source/drain metal layer 34. In the prior art, the power line 23 is usually disposed at the source/drain metal layers 34. This arrangement increases the number of wirings at the source/drain metal layers 34, and is disadvantageous for reducing the wiring width of the fan-out line area. In the present embodiment, the power line 23 is disposed at the touch-control metal layer 35, not occupying the layers where the fan-out lines corresponding to the first signal line 21 are located, and not increasing the number of wirings at the fan-out wiring area 103 corresponding to the first signal lines 21. Therefore the present configuration is advantageous for reducing the wiring width of the fan-out wiring area 103, saving the wiring space of the fan-out wiring area 103.

Optionally, referring to FIG. 4, a display panel 100 further includes a planarization layer 44, a light-emitting function layer 50, and a film encapsulation layer 60, which are sequentially disposed on the touch-control metal layer 35 in a direction away from the substrate 10.

The light emitting function layer 50 includes an anode layer 51, a light emitting material layer 52, a pixel defining layer 53, and a cathode layer 54 which are sequentially disposed in a direction away from the base substrate 10. The anode layer 51 is electrically connected to the source/drain metal layer 34.

Specifically, as shown in FIG. 4 and FIG. 12, the pixel circuit includes a switching thin film transistor 61 and a driving thin film transistor 62. The gate of the switching thin film transistor 61 is electrically connected to the gate line 24, the source of the switching thin film transistor 61 is electrically connected to the data signal line 22, and the drain of the switching thin film transistor 61 is electrically connected to the gate of the driving thin film transistor 62. A storage capacitor 70 is disposed between the gate of the driving thin film transistor 62 and the power source line 23. The source of the driving thin film transistor 62 is electrically connected to the power source line 23, and the drain of the driving thin film transistor 62 is electrically connected to the anode of an organic light emitting diode 92 (i.e., the light emitting functional layer 50). The power supply line 23 provides a supply voltage to the organic light emitting diode 92.

In the present embodiment, after the driving thin film transistor 62 is turned on, holes and electrons are, driven by the externally applied voltage, injected respectively from the anode layer 51 and the cathode layer 54 into the luminescent material layer 52. The holes and electrons meet, recombine, and release energy in the luminescent material layer 52, and then transfer energy to the organic luminescent material molecules in the organic luminescent material layer 52, making them transit from a ground state to an excited state. As the excited state is very unstable, the excited molecules transit from the excited state back to the ground state, and this is a radiation transition that produces a luminescence phenomenon. Based on this luminescence phenomenon, image display may be realized by organic light emitting diodes.

Referring to FIG. 4, a thin film encapsulation layer 60 is further disposed on the side of the light emitting function layer 50 away from the substrate 10 to isolate external moisture and oxygen. The thin film encapsulation layer 60 may prevent external water and oxygen from entering the light emitting function layer 50 and thus causing damage to the light emitting function layer 50.

Further, in the exemplary embodiment shown in FIG. 4, the thin film transistor integrated layer exhibits a top gate structure. That is, the gate metal layer 32 is located at the side of the semiconductor active layer 31 away from the substrate 10. The thin film transistor integrated layer may also exhibit a bottom gate structure. That is, the gate metal layer 32 may be located at the side of the semiconductor active layer 31 close to the substrate 10.

Figure 13:
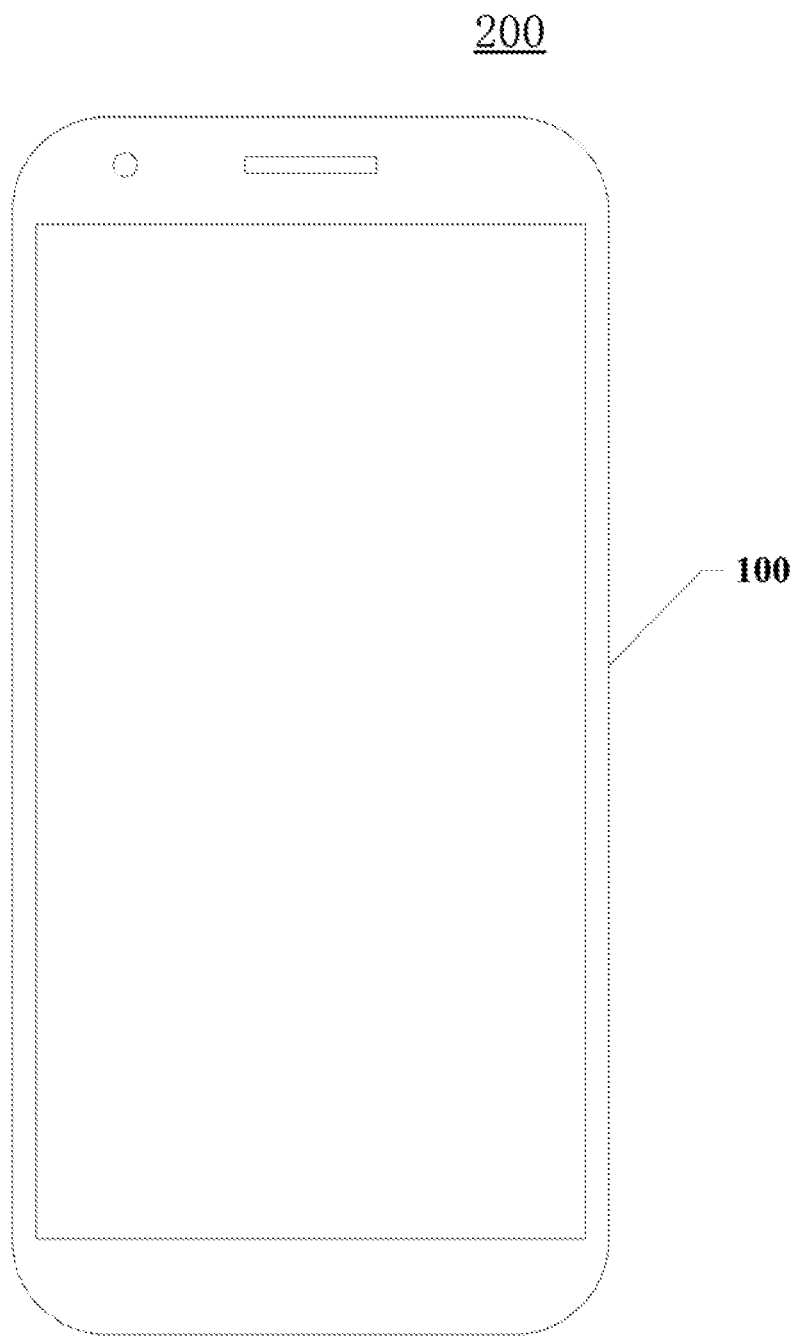
FIG. 13 illustrates a schematic structural diagram of an exemplary display device consistent with the disclosed embodiments.

FIG. 13 illustrates a schematic structural diagram of an exemplary display device consistent with the disclosed embodiments. As shown in FIG. 3, an exemplary display device 200 may comprise a display panel 100 with any one of the exemplary configurations of the above embodiments. The display device 200 may be any product or component having a display function, such as a tablet computer, a notebook computer, a television, a monitor, a digital photo frame, a navigator, a smartphone, a smartwatch, and the like. Although a smartphone is shown in FIG. 13, the display device 200 may be any appropriate type of content-presentation devices including any of the disclosed display panels. Because the disclosed display device 200 includes the disclosed display panel, the disclosed display device may also exhibit same advantages as the disclosed display panel.

In the display panels and the display devices provided by the present invention, the first signal lines located at the display area are connected to the binding area through fan-out lines in the fan-out wiring area. In particular, the fan-out lines corresponding to the first signal lines include the first fan-out line, the second-out line, and the third-out line. The first fan-out line, the second fan-out line, and the third out line are respectively located at different layers. Compared to the prior art, in the present invention, the fan-out lines originally located at a same layer in the prior art are distributed to three different layers. This configuration may decrease the overall width of the fan-out wiring area, saving the wiring space of the fan-out wiring area. Further, dividing the fan-out lines into three layers is also beneficial for decreasing the distance between the fan-out wiring area 103 and the binding area 104, and this is beneficial for achieving the narrow bottom frame design for display panels and display devices.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A display panel, comprising:
a substrate including a display area and a non-display area, wherein:
in the display area, a plurality of first signal lines are arranged along a first direction, and extend along a second direction;
the non-display area includes a fan-out wiring area and a binding area, and the fan-out wiring area is located between the display area and the binding area;
a plurality of fan-out lines are located in the fan-out wiring area, and a plurality of conductive connection portions are located in the binding area;
the fan-out lines include a first fan-out line, a second fan-out line, and a third fan-out line;
a first end of the first fan-out line, a first end of the second fan-out line, and a first end of the third fan-out line are electrically connected to the first signal lines, respectively;
the first fan-out line, the second fan-out line, and the third fan-out line are located at different layers, respectively;
the plurality of conductive connection portions are electrically connected to a second end of the first fan-out line, a second end of the second fan-out line, and a second end of the third fan-out line in one-to-one correspondence;
an orthographic projection of the second fan-out line on a plane of the substrate does not overlap with an orthographic projection of the first fan-out line on the plane of the substrate; and
the orthographic projection of the second fan-out line on the plane of the substrate does not overlap with an orthographic projection of the third fan-out line on the plane of the substrate.

2. The display panel according to claim 1, wherein:
the conductive connection portions include a first conductive connection portion, a second conductive connection portion, and a third conductive connection portion;
the first conductive connection portion, the second conductive connection portion, and the third conductive connection portion are located in a same layer; and
the first conductive connection portion and the second conductive connection portion are insulatively arranged along the second direction.

3. The display panel according to claim 2, wherein:
at least one first conductive connection portion and at least one second conductive connection portion are arranged in the second direction, combining into one conductive connection portion unit; and
the third conductive connection portion and the conductive connection portion unit are alternately arranged in the first direction.

4. The display panel according to claim 2, further comprising a gate metal layer, a first insulating layer, a capacitor metal layer, a second insulating layer, a source/drain metal layer, a third insulating layer, and a touch-control metal layer, sequentially disposed on the substrate in a direction away from the substrate, wherein the first fan-out line is located at the gate metal layer, the second fan-out line is located at the capacitor metal layer, and the third fan-out line is located at the source/drain metal layer.

5. The display panel according to claim 4, wherein:
the first conductive connection portion, the second conductive connection portion, and the third conductive connection portion are located at the source/drain metal layer;
the second end of the first fan-out line is electrically connected to the first conductive connection portion through a first via hole located at the first insulating layer and the second insulating layer;
the second end of the second fan-out line is electrically connected to the second conductive connection portion through a second via hole located on the second insulating layer.

6. The display panel according to claim 5, wherein:
the first signal line includes a data signal line that is located at the source/drain metal layer;
any three consecutive data signal lines are electrically connected to a first fan-out line, a second fan-out line, and a third fan-out line, respectively; and
any two adjacent data signal lines are electrically connected to fan-out lines located at different layers respectively.

7. The display panel according to claim 6, wherein the first end of the first fan-out line is electrically connected to a data signal line through a sixth via hole located at the first insulating layer and the second insulating layer; and the first end of the second fan-out line is electrically connected to a data signal line through a seventh via hole located at the second insulating layer.

8. The display panel according to claim 4, further comprising a plurality of power lines arranged along the first direction and extending along the second direction, wherein power lines are located at the touch-control metal layer.

9. The display panel according to claim 4, further comprising a planarization layer, a light-emitting function layer, and a film encapsulation layer, which are sequentially disposed on the touch-control metal layer in a direction away from the substrate, wherein:
the light emitting function layer includes an anode layer, a light emitting material layer, a pixel defining layer, and a cathode layer which are sequentially disposed in a direction away from the base substrate; and
the anode layer is electrically connected to the source/drain metal layer.

10. The display panel according to claim 4, wherein the gate metal layer is located at the side of the semiconductor active layer away from the substrate.

11. The display panel according to claim 4, wherein the gate metal layer is located at the side of the semiconductor active layer close to the substrate.

12. The display panel according to claim 4, wherein:
the first conductive connection portion, the second conductive connection portion, and the third conductive connection portion are located at the touch-control metal layer;
the second end of the first fan-out line is electrically connected to the first conductive connection portion through a third via hole located at the first insulating layer, the second insulating layer, and the third insulating layer;

the second end of the second fan-out line is electrically connected to the second conductive connection portion through a fourth via hole located at the second insulating layer and the third insulating layer; and the second end of the third fan-out line is electrically connected to the third conductive connection portion through a fifth via hole located at the third insulating layer.

13. The display panel according to claim 12, wherein:
the first signal line includes a data signal line that is located at the source/drain metal layer;
any three consecutive data signal lines are electrically connected to a first fan-out line, a second fan-out line, and a third fan-out line, respectively; and
any two adjacent data signal lines are electrically connected to fan-out lines located at different layers respectively.

14. The display panel according to claim 13, wherein the first end of the first fan-out line is electrically connected to a data signal line through a sixth via hole located at the first insulating layer and the second insulating layer; and the first end of the second fan-out line is electrically connected to a data signal line through a seventh via hole located at the second insulating layer.

15. The display panel according to claim 1, wherein an orthographic projection of the first fan-out line on a plane of the substrate and an orthographic projection of the third fan-out line on the plane of the substrate overlap.

16. A display device, comprising:
a display panel comprising a substrate including a display area and a non-display area, wherein:
in the display area, a plurality of first signal lines are arranged along a first direction, and extend along a second direction;
the non-display area includes a fan-out wiring area and a binding area, and the fan-out wiring area is located between the display area and the binding area;
a plurality of fan-out lines are located in the fan-out wiring area, and a plurality of conductive connection portions are located in the binding area;
the fan-out lines include a first fan-out line, a second fan-out line, and a third fan-out line;
a first end of the first fan-out line, a first end of the second fan-out line, and a first end of the third fan-out line are electrically connected to the first signal lines respectively;
the first fan-out line, the second fan-out line, and the third fan-out line are located at different layers, respectively;
the plurality of conductive connection portions are electrically connected to a second end of the first fan-out line, a second end of the second fan-out line, and a second end of the third fan-out line in one-to-one correspondence;
an orthographic projection of the second fan-out line on a plane of the substrate does not overlap with an orthographic projection of the first fan-out line on the plane of the substrate; and
the orthographic projection of the second fan-out line on the plane of the substrate does not overlap with an orthographic projection of the third fan-out line on the plane of the substrate.

17. A display panel, comprising:
a substrate including a display area and a non-display area, wherein:
in the display area, a plurality of first signal lines are arranged along a first direction, and extend along a second direction;
the non-display area includes a fan-out wiring area and a binding area, and the fan-out wiring area is located between the display area and the binding area;
a plurality of fan-out lines are located in the fan-out wiring area, and a plurality of conductive connection portions are located in the binding area;
the fan-out lines include a first fan-out line, a second fan-out line, and a third fan-out line;
a first end of the first fan-out line, a first end of the second fan-out line, and a first end of the third fan-out line are electrically connected to the first signal lines, respectively;
the first fan-out line, the second fan-out line, and the third fan-out line are located at different layers, respectively;
the plurality of conductive connection portions are electrically connected to a second end of the first fan-out line, a second end of the second fan-out line, and a second end of the third fan-out line in one-to-one correspondence;
the conductive connection portions include a first conductive connection portion, a second conductive connection portion, and a third conductive connection portion, that are located in a same layer; and
the first and second conductive connection portions are insulatively arranged along the second direction.

* * * * *